United States Patent
Vanaparthy et al.

(10) Patent No.: US 11,515,891 B2
(45) Date of Patent: Nov. 29, 2022

(54) APPLICATION OF LOW-DENSITY PARITY-CHECK CODES WITH CODEWORD SEGMENTATION

(71) Applicant: Intel Corporation, Santa Clara, CA (US)

(72) Inventors: Santhosh K. Vanaparthy, Santa Clara, CA (US); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/130,697

(22) Filed: Dec. 22, 2020

(65) Prior Publication Data
US 2021/0111738 A1   Apr. 15, 2021

(51) Int. Cl.
| | |
|---|---|
| *H03M 13/11* | (2006.01) |
| *H03M 13/43* | (2006.01) |
| *H03M 13/01* | (2006.01) |
| *H03M 13/15* | (2006.01) |

(52) U.S. Cl.
CPC .... *H03M 13/1137* (2013.01); *H03M 13/1157* (2013.01); *H03M 13/015* (2013.01); *H03M 13/1125* (2013.01); *H03M 13/1575* (2013.01); *H03M 13/43* (2013.01)

(58) Field of Classification Search
CPC ................ H03M 13/1137; H03M 13/1157
See application file for complete search history.

(56) References Cited

U.S. PATENT DOCUMENTS

| | | | |
|---|---|---|---|
| 8,499,226 | B2 | 7/2013 | Gunnam |
| 9,397,701 | B1 | 7/2016 | Micheloni et al. |
| 9,537,508 | B1 * | 1/2017 | Nguyen ............... H03M 13/118 |
| 9,755,732 | B1 * | 9/2017 | Caudill ............. H04B 7/18586 |
| 2005/0257124 | A1 | 11/2005 | Richardson et al. |
| 2007/0220398 | A1 | 9/2007 | Moon et al. |
| 2009/0049234 | A1 | 2/2009 | Oh et al. |
| 2010/0241921 | A1 | 9/2010 | Gunnam |
| 2012/0233524 | A1 | 9/2012 | Varnica et al. |
| 2014/0122979 | A1 | 5/2014 | Chen et al. |
| 2016/0204865 | A1 | 7/2016 | Boroson et al. |

(Continued)

FOREIGN PATENT DOCUMENTS

CN    103166648 A    6/2013

OTHER PUBLICATIONS

"Adaptive Decoding Algorithms for LDPC Codes" IEEE (Published 2012)—(Zhang et al.).

(Continued)

*Primary Examiner* — Joseph D Torres
(74) *Attorney, Agent, or Firm* — Compass IP Law PC

(57) ABSTRACT

A low-density parity-check (LDPC) decoder performs check node computations as N different segments of the check nodes which have connections only to a codeword segment of length C/N bits as well as check nodes that have connections across the entire codeword of length C. The decoder can include a controller or other compute hardware to decode the codeword, including to perform computations for separate segments of C/N bits of the codeword. The system can perform computations including adjustment of the decode computations based on an expected error rate for selected segments of the codeword.

14 Claims, 9 Drawing Sheets

(56) References Cited

U.S. PATENT DOCUMENTS

| | | |
|---|---|---|
| 2017/0031608 A1 | 2/2017 | Waizy et al. |
| 2018/0013446 A1 | 1/2018 | Milicevic et al. |
| 2018/0026659 A1 | 1/2018 | Kim et al. |
| 2018/0107591 A1 | 4/2018 | Smith |
| 2018/0262215 A1* | 9/2018 | Sharon ................ G06F 11/1012 |
| 2018/0351575 A1 | 12/2018 | Chen et al. |
| 2019/0097656 A1 | 3/2019 | Bhatia et al. |
| 2019/0104078 A1 | 4/2019 | Kachrani et al. |
| 2019/0190539 A1* | 6/2019 | Yang ................. H03M 13/6577 |
| 2019/0190543 A1 | 6/2019 | Young et al. |
| 2019/0326930 A1* | 10/2019 | Palangappa ....... H03M 13/6502 |

OTHER PUBLICATIONS

First Office Action for U.S. Appl. No. 16/458,021, dated Oct. 23, 2020, 25 pages.

Li, Huan, et al., "A Low-Complexity Min-Sum Decoding Algorithm for LDPC Codes", 2017 17th IEEE International Conference on Communication Technology, 4 pages.

Leiner, "LDPC Codes—A Brief Tutorial", Apr. 8, 2005, 9 pages.

Shokrollahi, "LDPC Codes: An Introduction", Digital Fountain, Inc., Fremont, CA, Apr. 2, 2003, 34 pages.

* cited by examiner

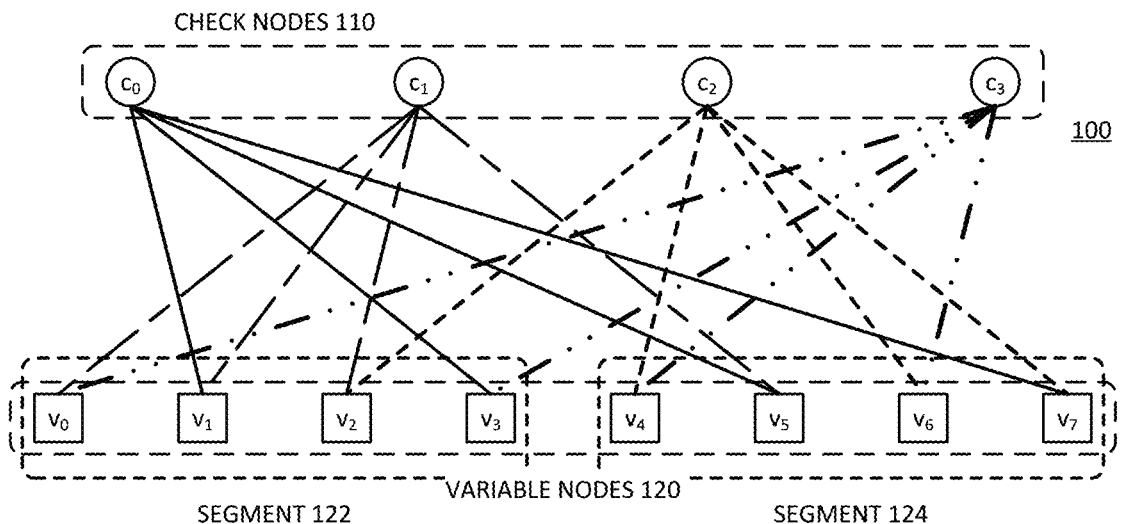
FIG. 1A
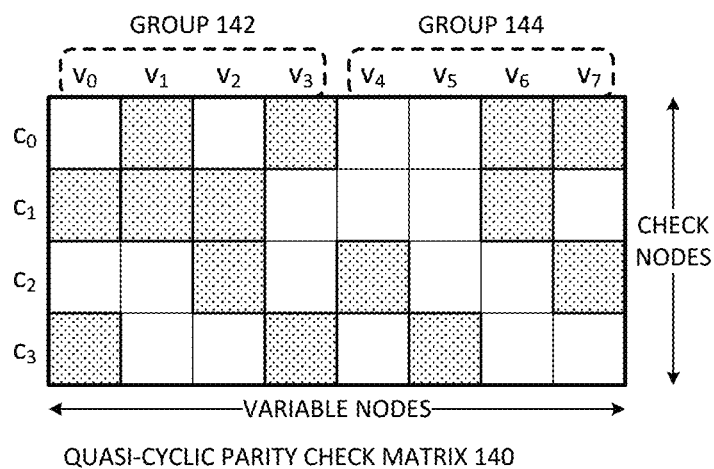
FIG. 1B
FIG. 1C

CONSTRAINED CIRCULANT 610

APPLICATION OF LOW-DENSITY PARITY-CHECK CODES WITH CODEWORD SEGMENTATION

FIELD

Descriptions are generally related to error-correcting codes, and more particular descriptions are related to different applications of low-density parity-check (LDPC) codes.

BACKGROUND

Low density parity check (LDPC) codes error correction with low latency decoding and the ability to use soft information to improve the decoding performance. LDPC decoders have two sets of nodes: check nodes and variable nodes. The longer the codeword length for an LDPC code, the better the decoding performance tends to be in general.

Traditional application of error-correcting codes involves either decoding the entire codeword without raw bit error rate (RBER) information for the different portions of the codeword, or would require soft information to improve decoding correction in the form of log-likelihood ratio (LLR) for different bits within the codeword. However, obtaining soft information involves costly overhead, which may prevent its use in a high throughput decoder implementation. The cost of implementing an LDPC decoder with RBER diversity could involve significant amounts of storage space for the check node operation. The cost of not applying RBER diversity information is reduced RBER correction strength.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 1A is a block diagram of an example of a Tanner graph for a system in which check nodes can be used in sub-groups.

FIG. 1B is a representation of an H-matrix for the Tanner graph of FIG. 1A.

FIG. 1C is a block diagram of an example of a parity check matrix for the Tanner graph of FIG. 1A.

Figure 2:
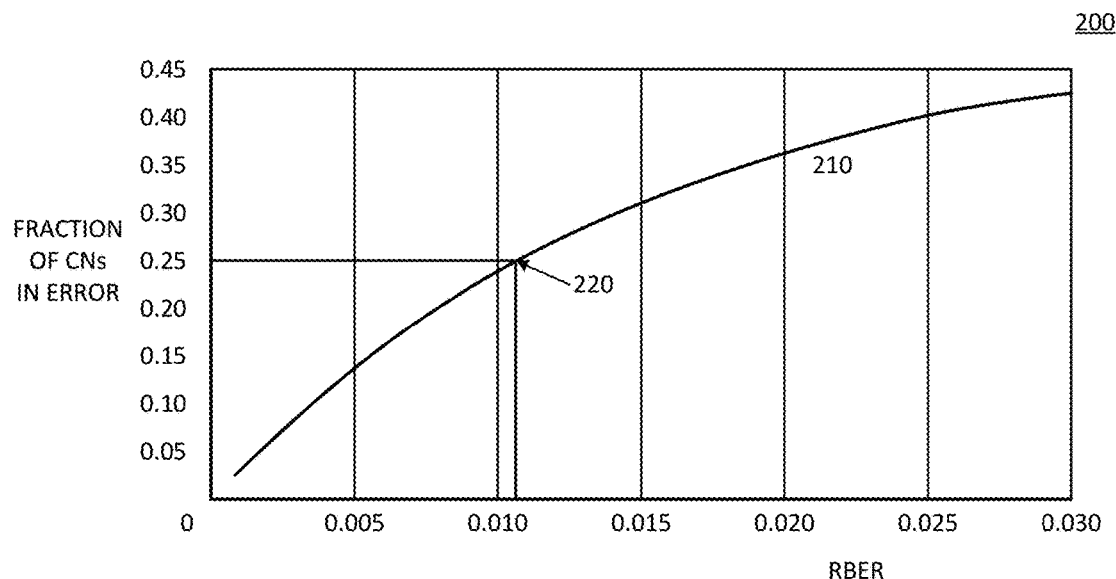
FIG. 2 is a representation of an example of a graph for initial LLR assignment.

Descriptions of certain details and implementations follow, including non-limiting descriptions of the figures, which may depict some or all examples, and well as other potential implementations.

DETAILED DESCRIPTION

Low-Density Parity-Check (LDPC) codes are a class of Error Correction Codes (ECC) that can provide low latency decoding, support soft information decoding, and can achieve capacity. LDPC codes are generally specified using a parity-check matrix (e.g., an H matrix), which computes the syndrome (error signature consisting of a bit vector) for a noisy codeword. Any received vector whose syndrome is zero is considered to be a valid codeword. As described herein, the decoder can separately check segments of the codeword for zero syndrome, as well as the entire codeword. The process of decoding with LDPC codes includes iteratively moving from a noisy vector (i.e., a syndrome that is not all zeros) to a corrected codeword (i.e., the syndrome is all zeros). There are several examples of decoding algorithms like bit-flipping decoder, layered decoder, sum-product decoders, etc.

As described herein, an LDPC code consists of variable and check nodes, where each variable-node corresponds to a bit of the codeword with length C. The LDPC decoder can perform computations as N different segments of the check nodes which have connections only to a codeword segment of length C/N bits as well as check nodes that have connections across the entire codeword of length C. The decoder can include a controller or other compute hardware to correct the codeword. The hardware performs computations for separate segments of the C/N codeword bits. The system can perform computations including adjustment of the decode computations based on an expected error rate for different segments of the codeword.

LDPC encoding and decoding can be used in noisy environments to reduce the error rate in transmission of a signal. High-speed, high-bandwidth communication systems such as optical communication, video communication, memory subsystems, or other systems, have high noise for the transmission of signal data. In high speed communication, there is a statistically significant probability that a data bit transmitted is received in error. Additionally, high density nonvolatile memories (NVM) such as 3D NAND (three-dimensional memory based on inverted AND logic, also popularly referred to as flash memory) and 3DXP (three-dimensional cross-point, or other resistive memory technology) are inherently noisy media. In noisy storage media, there is a statistically significant probability that a bit written and then later read will be in error.

The codeword to be decoded by the LDPC system can have diversity of raw bit-error rate (RBER) across different groups of bits of the codeword, or in different segments of the codeword. The raw bit error rate (RBER) can refer to the error rate of the transmission system or storage device, or the bit error rate (BER) prior to correction. The RBER can be reduced to acceptable output error rates in a system by the application of error correction. The decoding applies error correction to maintain the error rate at acceptable levels to enable higher transmission rates for data transfer or enable higher data density (bits per area) of a storage medium. The ability to segment the codeword by RBER diversity can improve the decoding performance.

As one example, for a 3DXP system having a 2 KB (kilobyte) codeword length, different segments of 512 B can have RBER diversity. The specific codeword and segment lengths are non-limiting examples. Different implementations can have different codeword length, different segment length/size, or both different codeword length and different segment length.

Figure 5:
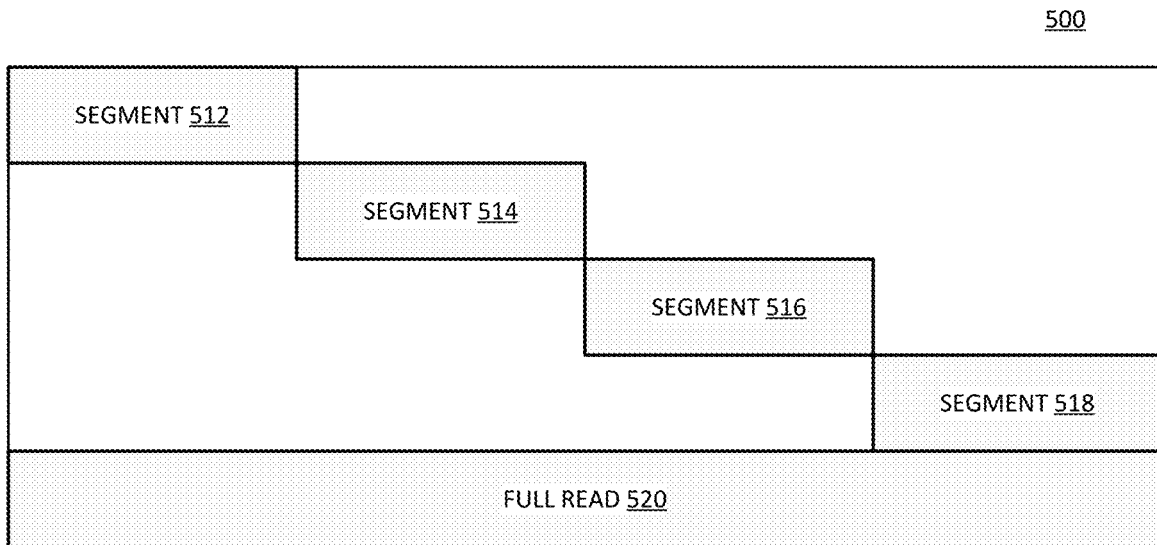
FIG. 5 is a block diagram of an example of codeword decoding.

One application of LDPC uses constrained codes, whose parity-check matrix has the structure described in FIG. 5. The application of LDPC to a codeword treated as different segments provides a constrained code architecture for the decoding of the codeword. In one example, the decoding occurs one segment at a time, or the decoding occurs first on a selected segment without automatically performing the decoding for the entire codeword. Such decoding can be referred to as partial area decoding, applying check node operations on a portion or segment of the codeword. In one example, decoding ends if the segment passes decoding. In one example, if a decode for a partial area fails, the decoder applies a full decode by using information from the other segments.

In one example, a system such as a storage system can include different read size portions, which results in different amounts of data being accessible for an operation. Returning to the example above, consider a system that has a read size of 512 B, and can read 2 KB. The LDPC decoding can be applied to a read segment of 512 B, and if the decode for that segment fails, the system can obtain the data for the full 2 KB codeword and perform the decoding with the addition of the other three 512 B segments. As such, the system can first attempt to decode a segment of the codeword, and can apply stronger decoding by using the full codeword if the segment cannot be decoded properly by itself.

It will be understood that a smaller codeword will take less time to decode than a longer codeword, but that the longer codeword will have more robust decoding. The system can perform decoding either for the specific segments, or for the full codeword, or for both a specific segment and the full codeword. In one example, the application of decoding to the segments allows the application of different log likelihood ratio (LLR) information for the different codeword segments. Given that the different segments of the full codeword can be treated individually, the LLR information can be applied individually to the different segments. Given that segments of the full code can decode faster than others, for example, due to fewer errors in a selected segment, due to RBER diversity, or due to early decoding, the decoder can shorten the full decode time. The decoder can increase the LLR of the decoded portions to increase the decoding rate for the remaining portions of the codeword.

FIG. 1A is a block diagram of an example of a Tanner graph for a system in which check nodes can be used in sub-groups. The Tanner graph in system 100 represents the LDPC decoding based on relationships or messaging between nodes, where the nodes include check nodes 110 and variable nodes 120. Check nodes 110 are represented together as one set of nodes, and variable nodes 120 are represented as a separate set of nodes. In one example, variable nodes 120 can be used as segment 122, segment 124, or as the full group of variable nodes 120 (including segment 122 and segment 124). The lines between specified nodes represents the messaging or message passing for the decoding.

LDPC decoding performs message passing to share bit-reliabilities between nodes. Variable nodes 120 correspond to the input codeword, and can alternatively be referred to as bit nodes or v-nodes. The input codeword can be the bits from the media (e.g., NAND, 3DXP, or other storage media, or a communication line). Check nodes 110 represent the parity check equation, and can alternatively be referred to as function nodes.

The line or connection between two nodes represents a non-zero element in an LDPC H-matrix (illustrated in FIG. 1B). It will be observed that check nodes 110 are numbered c[0:3] and the variable nodes are numbered v[0:7], representing a (8,4) LDPC code. As an example of the coding, consider CN c0, which has connections to v1, v3, v5, and v7, representing 1's in columns 1, 3, 5, and 7 on row 0. For row 1, the connections from c1 to v0, v1, v2, and v5 indicate 1's in columns 0, 1, 2, and 5.

FIG. 1B is a representation of an H-matrix for the Tanner graph of FIG. 1A. H-matrix 130 provides an LDPC matrix definition of the mapping illustrated by the Tanner graph of system 100. H-matrix 130 is an N×M matrix with N=8 rows by M=4 columns for a (8,4) code. For a low density matrix, the number of ones per row on average should typically not be more than half the number of nodes per row, and the number of ones per column on average should typically not be more than half the number of nodes per column.

H-matrix 130 has rows corresponding to the check nodes and columns corresponding to the variable nodes. Row 0 is [0 1 0 1 0 1 0 1], corresponding to c0->{v1, v3, v5, v7}, meaning c0 is connected to the v-nodes in the brackets. Row 1 is [1 1 1 0 0 1 0 0], corresponding to c1->{v0, v1, v2, v5}, Row 2 is [0 0 1 0 1 0 1 1], corresponding to c2->{v2, v4, v6, v7}, and Row 3 is [1 0 0 1 1 0 0 1], corresponding to c3->{v0, v3, v4, v6}, As such, each column has two non-zero check nodes, and each row has four non-zero nodes.

H-matrix 130 represents a regular LDPC matrix given that all rows and columns have an equal number of non-zero nodes. While not specifically illustrated, the H-matrix could alternatively be an irregular matrix, in which the average number of non-zero nodes is the same, but there are columns or rows (or both columns and rows) that have different numbers of non-zero nodes. It will be understood that H-matrix 130 is one simple example of an H-matrix for purposes of explanation, and does not necessarily represent a matrix for any practical system that would implement codeword segmentation as described herein.

FIG. 1C is a block diagram of an example of a parity check matrix for the Tanner graph of FIG. 1A. Whereas H-matrix 130 illustrates the matrix definition, matrix 140 illustrates a matrix representation with each box representing a location or node in the matrix, with shaded boxes being non-zero and the white spaces being zeros. Each column corresponds to a variable node or bit node, and each row corresponds to a parity check equation or check node. Each non-zero element in the matrix represents a connection between these two types of nodes.

Matrix 140 can be referred to as a quasi-cyclic parity check matrix. In an implementation of an LDPC system, the LDPC code can be specified by a quasi-cyclic parity-check matrix (the H-matrix), which has rows and columns of square cyclic submatrices (circulants) that are typically identity matrices rotated by varying offsets. In one example, the circulants of the codeword are constrained to where non-zero values can be stored. Constraining the circulants can reduce the circulant size, which will constrain the check nodes that need to be active during any clock cycle. In one example, system 100 applies selective grouping of portions of a codeword to treat the input as a constrained code.

As with system 100, matrix 140 can include two groups of nodes, identified as group 142 and group 144. It will be understood that different implementations can use more group or more segments of nodes. Group 142 can correspond to segment 122 of system 100 and group 144 can correspond to segment 124 of system 100.

FIG. 2 is a representation of an example of a chart for initial LLR assignment. Graph 200 represents a graph of RBER versus fraction of check nodes having errors. The fraction of check nodes having errors can be a confidence scale or confidence rate or confidence information value. Graph 200 can be said to map the relationship of input RBER to syndrome weight. Graph 200 includes curve 210, which is one example of a curve for an implementation of a memory device. The curve can be different for different system implementations.

It is possible to estimate the input RBER based on the number of unsatisfied check-equations just before the start of the decoding. The (normalized) sum of unsatisfied check-equations can be referred to as the syndrome weight. For example, for the LDPC code for the example of graph 200, point 220 represents an intersection of curve 210 for a fraction of unsatisfied check equations at around 0.25, which estimates the input RBER at around 0.011.

Thus, even if no confidence information is given from the media, the system can assign an initial LLR based on an a priori calculated analysis. The normalization of the errors for the system can be determined during testing or characterization of the device. Curve 210 can be determined with a statistical a prior analysis, which the decoder can use on the fly by programming the information into the decoder device. Programming the information into the decoder device can enable the decoder to provide initial LLR assignments to the check nodes. High LLR indicates a high confidence in the assigned value. Low LLR indicates low confidence in the assigned value.

In one example, the decoder can adjust its computations by the assignment of LLR values based on expected error rate, for example, as indicated in graph 200. The different check nodes in different segments can have different expected error rates. Thus, the system can apply variable check node weighting to check nodes based on the expected error rate for the selected check nodes. In one example, the expected error rate refers to RBER.

In one example, the variable check node weighting is applied to check nodes based on threshold error rates. For example, it will be understood that curve 210 has infinite points. Rather than applying weighting based on infinitely small degrees of difference along the curve, in one example, the decoder can apply weights or scaling based on threshold values. The threshold values can be, for example, different points on the graph. When a threshold point is reached, the decoder can apply a weight or scaling for the range from the threshold point to a next threshold.

Figure 3:
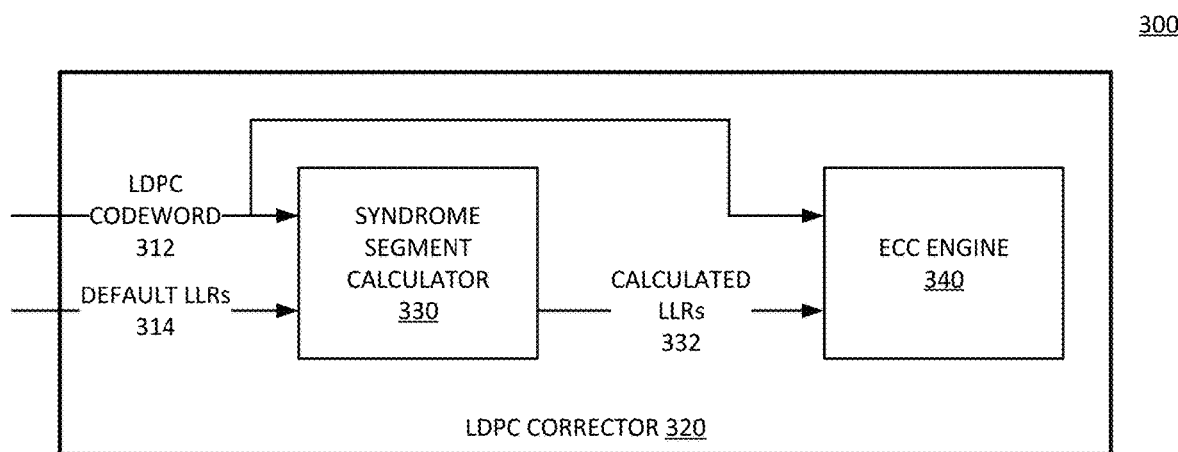
FIG. 3 is a block diagram of an example of a system for decoding based on LDPC.

FIG. 3 is a block diagram of an example of a system for decoding based on LDPC. System 300 represents a system that can perform decoding based on segmentation of the codeword. In a traditional implementation of LDPC, the LDPC corrector would include an ECC (error checking and correcting) engine that would perform ECC in accordance with LLR values that have the same magnitude for all bits.

In system 300, LDPC corrector 320 includes ECC engine 340, which can be the same or similar to an ECC engine for a traditional system. ECC engine 340 performs ECC computations to determine the syndrome for a codeword bit or set of bits. ECC computations typically include XOR (exclusive OR) operations to determine whether a group of bits matches column in the H-matrix, and computations based on the likelihood of the resulting codeword. The computations can be performed iteratively based on the likelihoods to arrive at a determined syndrome, based on the weighting.

In contrast to the traditional system that would use the same weighting for all LLR values, in one example, system 300 enables different weighting for different segments of the codeword. Thus, system 300 can provide input to ECC engine 340 with different LLR values set for the syndrome value across different parts of the codeword.

LDPC corrector 320 can receive LDPC codeword 312, which represents the input codeword to be decoded. LDPC corrector 320 represents an example of a decoder that performs decoding operations based on segmentation of the codeword. In one example, LDPC codeword 312 represents read data from a memory device (e.g., a 3DXP memory device or 3D NAND device), where LDPC corrector 320 represents an LDPC decoder of the memory device. In one example, LDPC codeword 312 represents received data of a communication system (e.g., wireless communication system or optical communication system), where LDPC corrector 320 represents an LDPC decoder of the communication subsystem.

LDPC corrector 320 can access default LLRs 314. Default LLRs 314 represent LLR values assigned by default to the decoding, and represent initial LLR values LDPC corrector 320 would traditionally use for all bits. In system 300, LDPC corrector 320 includes syndrome segment calculator 330, which can modify the LLR assignment for different segments of the codeword. Thus, instead of default LLR values for all parts of the codeword, syndrome segment generator 330 generates calculated LLRs 332, which represent LLR values for specific segments of LDPC 312. Thus, ECC engine 340 will apply different LLR values for syndrome calculations based on what segment of the codeword is being computed.

In one example, syndrome segment calculator 330 receives LDPC codeword 312 to identify the segmentation of the LLR values. LDPC codeword 312 is also provided to ECC engine 340 for the syndrome computations based on calculated LLRs 332 generated by the differentiation of the segments. In one example, syndrome segment calculator 330 accesses error rate information such as that of graph 200 of FIG. 2 for application of scaling, weighting, or LLR assignment.

It will be understood that ECC engine 340 will provide different RBER correction strength as compared to a traditional ECC engine. For example, consider a codeword that has an average RBER of 1.00E-3. A traditional ECC engine would have the same decoding failure rate for that codeword whether the entire codeword has the average RBER, or whether there were different segments of the codeword that had higher RBER and others that had lower RBER, to result in the average decoding failure rate of 1.00E-3. In contrast, ECC engine 340 of LDPC corrector 320 will have one decoding failure rate when all bits are subject to the average RBER of 1.00E-3, and will have a different, improved decoding failure rate if there are segments of the codeword that have RBER better than the average and segments that have worse than the average, where overall the codeword has the same average RBER of 1.00E-3. Thus, as different portions of the codeword are treated separately, system 300 will provide improved correction strength over a traditional system.

The ability to treat different segments of the codeword separately enables other capability in the decoding. In one example, system 300 shortens the decoding operation based on detection of an error-free segment. In one example, system 300 applies variable check node scaling. In one example, system 300 applies variable syndrome weights. In one example, system 300 applies shortening, variable check node scaling, and variable syndrome weighting, or a combination of two or more of these. In addition to applying the techniques of shortening, variable check node scaling, and variable syndrome weighting, or a combination of these to an implementation of codeword segmentation, the techniques can apply to all systems that utilize constrained codes.

Shortening can refer to the ability to exclude a portion or segment of the codeword from decoding or ECC computations once a zero-syndrome has been determined for the segment. Thus, the iterations can continue for the other segments of the codeword, but the overall computing is shortened based on the exclusion of a segment with no errors. A traditional system would take as long and consume as much power to decode a codeword with error concentrated in one segment as having the same number of errors spread across the codeword. System 300 may take approximately the same amount of time and power as the traditional system in the case where the errors are spread across the codeword. In contrast, in one example, system 300 would use less power and perform the decoding faster as compared to the traditional system if errors in the codeword were concentrated in one segment.

Check node scaling refers to the application of a scaling factor to check nodes based on a class of the check nodes. A scaling factor is a factor that can be applied to the check nodes for their computations, to scale the resulting calculations. System 300 can apply variable check node scaling factors depending on the class of the check nodes. The class of the check nodes can refer to what segment of the codeword they are computing. For example, check nodes that will perform computations on a segment of the codeword that has certain expected error rates or has been computed to have a high confidence factor in a previous computation can be assigned different scaling factors.

In one example, unlike a traditional decoder, LDPC corrector 320 can be a decoder that would provide soft output values that show different scaling factors to apply to check nodes based on identification of the check nodes. In one example, syndrome segment calculator 330 can assign classes to check nodes based on which segment of LDPC codeword 312 they will apply to. In one example, the class of the check nodes can correspond to what addresses they have in the decoding architecture, and thus, based on which segment of the codeword they will perform computations. In one example, the class of the check nodes corresponds to an expected error rate for the segment of the codeword on which they will perform computations. For example, the expected error rate can be the RBER for the segment of the codeword corresponding to the selected check nodes or selected segment of check nodes. In one example, the class of the check nodes corresponds to check nodes whose computations have error rates above a threshold error rate.

Variable syndrome weighting refers to the application of confidence factors for partial syndromes. In one example, system 300 can apply decoding to selected segments of LDPC codeword 312 instead of to the entire codeword. Decoding a selected segment can be performed as a technique to decode only a selected segment, which may not require decoding of the entire codeword in certain applications where only part of the codeword will be used, for example. In other applications, the entire codeword will be used, and system 300 performs partial decoding of the codeword in segments before performing the decoding of the entire codeword.

With variable syndrome weighting, in one example, syndrome segment calculator 330 can segment the codeword and ECC engine 340 can perform calculations one segment at a time. After computing partial syndromes based on the segments individually, LDPC corrector 320 can assign variable weights to the partial syndromes, based on varying confidence factors for the separate segments. In one example, system 300 can identify the RBER for each section or each segment and assign an LLR scaling factor to each check node segment based on the RBER. System 300 can assign a confidence factor for the partial syndromes and then use the confidence factors of the partial syndromes for a full decode of the entire codeword. The computed partial syndromes with weighting can increase the strength of the decoding, can reduce the power associated with the decoding, can decrease the time for the full decoding, or some combination of these.

The improved RBER correction of system 300 over a traditional decoder can improve the life and performance of memory or storage media that experiences high error rates. System 300 provides superior correctability for error correction as compared to traditional error correction techniques. In addition, system 300 can improve RBER correction strength and improve power efficiency for memory or storage media, as well as of communication systems.

In one example, system 300 represents a system for LDPC decoding a codeword having length C, with check node computations performed as N segments of check nodes on C/N bits of the codeword as well as check nodes that have connections across the entire codeword of length C. For example, LDPC codeword 312 can be segmented as N segments of C/N codeword bits. LDPC corrector 320 and ECC engine 340 can provide an example of compute hardware to decode the codeword with N segments of check nodes. In addition to the full decode involving all the check-nodes, the decoder can also perform computations for separate segments of C/N bits of the codeword with the N segments of the check nodes. In accordance with any example described, system can adjust the check node computations from standard computation based on fixed LLR, based on an expected error rate for computations of selected segments of check nodes. Thus, different segments of check nodes can have different computations based on the expected error rate. The expected error rate can corresponding to an expected error rate of computations based on the corresponding segment of the codeword on which the check nodes perform computations.

In one example, LDPC codeword 312 represents a high bandwidth signal, such as a memory system signal or a communication signal. The memory system signal can refer to the data bits read from the memory device, which can occur at high bandwidth on fast communication channels.

The communication signal can refer to a wireless, wired, or optical communication signal that uses high bandwidth.

In one example, system 300 can apply variable check node scaling, to adjust the check node computations based on selectively adjusting a weighting factor for one of the (N+1) segments of the check nodes based on the class of the check nodes. The (N+1) segments refers to N segments with partial connections (of a length of the full codeword divided by the number of segments) to a segment of the codeword and one segment with connections across the entire codeword. For example, the weighting factor can be adjusted based on an address of check nodes in the architecture, to identify which check nodes will perform computations on which segments of the codeword. As another example, the weighting can be adjusted based on an expected error rate for the computations of the selected segments of check nodes. As another example, the weighting can be adjusted based on the raw bit error rate (RBER) for selected segments of the C/N bits of the codeword. As another example, the weighting can be adjusted based on a threshold error rate, where check nodes having an error rate above the threshold error rate have different weighting than those check nodes that have an error rate below the threshold. The threshold can be multiple thresholds, for different groupings of check nodes based on ranges of error rate.

Figure 4:
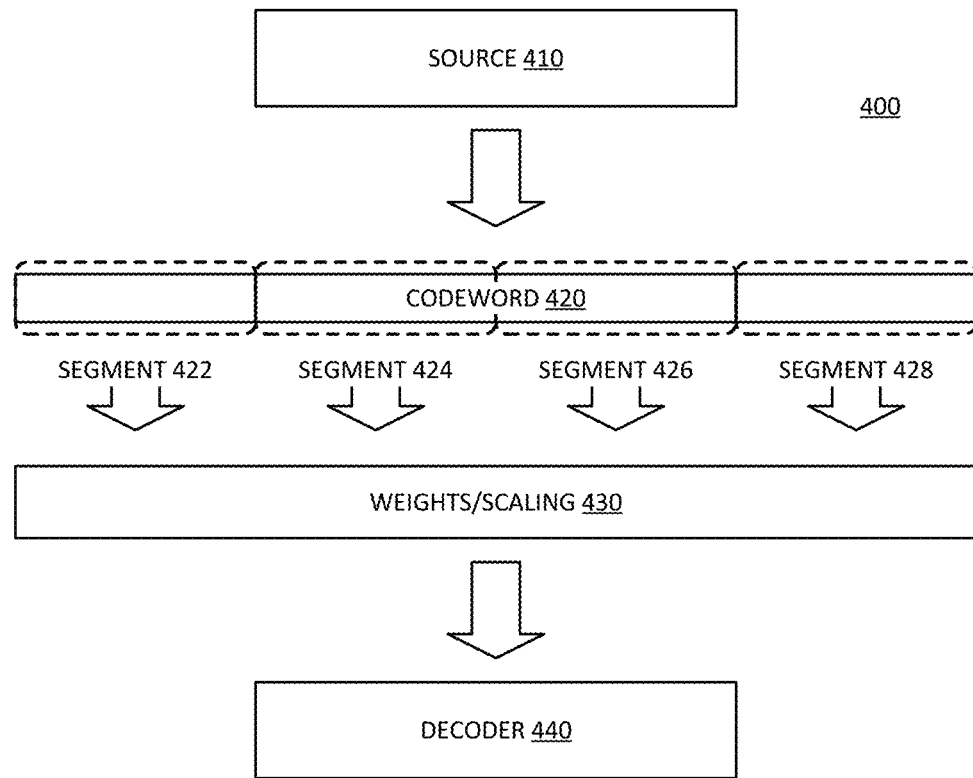
FIG. 4 is a block diagram of an example of decoding a codeword in portions based on LDPC.

FIG. 4 is a block diagram of an example of decoding a codeword in portions based on LDPC. System 400 provides an example of a system in accordance with system 300 of FIG. 3. Source 410 of system 400 represents the source of the codeword, such as a high bandwidth data source. Codeword 420 represents the codeword segmented into four segments for decoding. Weight/scaling 430 represents the assignment of check node weighting, scaling, or LLR assignment based on which check nodes correspond to which segment of codeword 420. Decoder 440 represents the computation or processing hardware to perform the computations.

As illustrated, codeword 420 is segmented into segment 422, segment 424, segment 426, and segment 428. Codeword 420 can alternatively be segmented into more or fewer segments. Different groups of check nodes will perform calculations on the different segments in accordance with a constrained code architecture. Weights/scaling 430 represents the ability of system 400 to adjust the operation of the check node computations based on various factors, which can be related to expected error rate for the various segments of codeword 420. In one example, weights/scaling 430 is part of decoder 440. Weights/scaling 430 provides adjustments to be applied to different segments of codeword 420 in the calculations by decoder 440 (by the check nodes of the decoder). In one example, the adjustments can be set per iteration of the decoding.

In one example, system 400, through weights/scaling 430, can apply different initial LLR assignments to different segments of the check nodes corresponding to the different segments of codeword 420 (segment 422, segment 424, segment 426, and segment 428). LLR is typically assigned as a value between 0 to 1 to indicate a confidence or a likelihood that the relationship is correct. Higher LLR is associated with a higher confidence, and thus, a higher likelihood that the syndrome is zero or close to zero. The segments can be assigned different initial LLR values based on position within the codeword or computation of a previous decoding for the selected segment.

In one example, decoder 440 decodes the distinct segments of codeword 420 separately prior to decoding the entire codeword. Decoding the distinct parts separately enables system 400 to apply check nodes constraints only over the smaller segments of the full codeword. The check nodes enable system 400 to estimate the RBER corresponding to the respective segments or portions of the full codeword. Using RBER estimates for different parts of the codeword, weights/scaling 430 can set the initial LLR for the corresponding bits of the codeword, generating different results with the check node calculations than would be achieved with a traditional system.

In one example, decoder 440 can apply shortening to the decoding operation, as described above. In one example, decoder 440 applies shortening based on the output of computations in an iteration of the decoding. In one example, weights/scaling 430 can provide weights or scaling to indicate to decoder 440 that the computations can exclude one or more segments. In one example, decoder 440 can apply varying scaling factors to the computations of different check nodes, with scaling provided by weights/scaling 430. In one example, the scaling of messages can be applied different for every iteration of check node computations.

FIG. 5 is a block diagram of an example of codeword decoding. System 500 represents codeword decoding in accordance with an example of system 300 of FIG. 3, or an example of system 400 of FIG. 4. System 500 can represent a parity check matrix of a constrained code.

In system 500, the parity bits of the entire codeword can be considered as being split into five parts. The parity bits can be considered split into four parts for four individual segment calculations, with a fifth part being parity bits for the entire codeword for decoding of the entire codeword.

In one example, full read 520 represents parity bits for the full codeword. As one example, the codeword could be a 2 KB codeword. System 500 represents four segments, segment 512, segment 514, segment 516, and segment 518. In the example of a 2 KB codeword, each segment would have a length of 512 B. The check equations for each of segment 512, segment 514, segment 516, and segment 518 involve only the bits corresponding to a given ¼ portion of the codeword. In one example, full read 520 includes check equations for all bits of the codeword.

In one example, the parity bits of full read 520 can only indicate the average RBER across the entire codeword. However, the parity bits for segment 512, segment 514, segment 516, and segment 518 can estimate the RBER individually across the four different parts. In one example, a decoder first estimates the RBER for the individual segments, then sets the magnitude of the LLR values based on the syndrome values corresponding to the four different parts, or the number of segments in an implementation where some segmentation other than 4 segments is used. The larger the syndrome value, the higher the RBER, resulting in a lower magnitude of the LLR.

From system 500, it will be understood that different weighting factors can be applied to different groups of check nodes corresponding to the different segments. Additionally, in one example, system 500 supports shortening. Consider that for segment 512, segment 514, segment 516, and segment 518 the parity bits only involve variable nodes from their respective segments. As such, the decoder can identify if any of the segments of the codeword are error free from the unsatisfied check equations in the four distinct segments of the parity bits. If any of the segments are error free, in one example, the decoder can shorten them and remove those nodes from participation in the subsequent iterations of the message passage algorithm. Removing these nodes substantially reduces the power consumption of the overall decoder.

Shortening parts of the codeword that are known to be error free also reduces the time to decode for the other parts.

For example, if segment 512 has errors and segment 516 has no errors, the decoder can decode segment 512 with segment 512, segment 514, and segment 518 to focus only on the uncorrected portions. Shortening the decoding allows the decoder to freeze partial bits or stop updating selected bits with respect to the full matrix, since the bits in the selected area are already correct. The decoder can then focus on updating the incorrect bits. The system then does not have to pass messages for computation with the frozen segment.

Consider that segment 512, segment 514, segment 516, and segment 518 correspond to individually accessible portions of the overall codeword, and can be detected individually. The system can first attempt to decode only a selected segment. In one example, only if the decode for the selected segment fails, then the decoder will access the other portions to perform decoding.

In system 500, full read 520 can be considered a fifth segment, which has parity bits from the entire codeword, which are distinct from the parity bits of segment 512, segment 514, segment 516, and segment 518. As one example, a storage device code was constructed in which the parity bits involving all variable nodes over the entire codeword was nearly five times that of the other parity bits.

System 500 can be used with the application of different scaling factors for the check equations to substantially improve the RBER correction. For a specific system configuration with the code constructed for the storage device, there was an improvement of approximately 10% in RBER correction strength as compared to a traditional code that was not segmented.

Figure 6A:
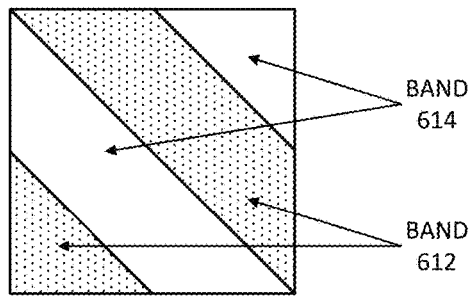
FIG. 6A is a block diagram of an example of a bounded or constrained circulant.

FIG. 6A is a block diagram of an example of a bounded or constrained circulant. Constrained circulant 610 represents a circulant that has constraints on where non-zero elements can exist. Constrained circulant 610 can represent the general concept of segmentation of a codeword, where the code segments can represent the constrained sections of the code.

As described above, LDPC decoding with a min-sum algorithm, belief propagation (SPA) algorithm, or bit flipping algorithm, the decoder system typically passes messages between variable bit nodes (H matrix columns) and parity check nodes (H matrix rows). The exchange of messages takes multiple iterations. In one example, the system applies message passing between variable and check nodes that corresponds to a square sub-matrix or circulant in one sub-iteration. In one example, a subset of variable nodes from each circulant row is processed in a sub-iteration. When variable nodes are processed using circulants, multiple check nodes will receive messages from the variable nodes and will be updated.

Circulant 610 has constrained areas in which the ones or non-zero elements in each circulant can placed. When all non-zero elements fall within a diagonal band of locations, the number of connections needed can be smaller, resulting in lower area utilization. In circulant 610, the shaded areas indicated as bands 612 represent allowed locations for non-zero elements. The non-shaded areas indicated as bands 614 represent areas that will only contain zeros.

Figure 6B:
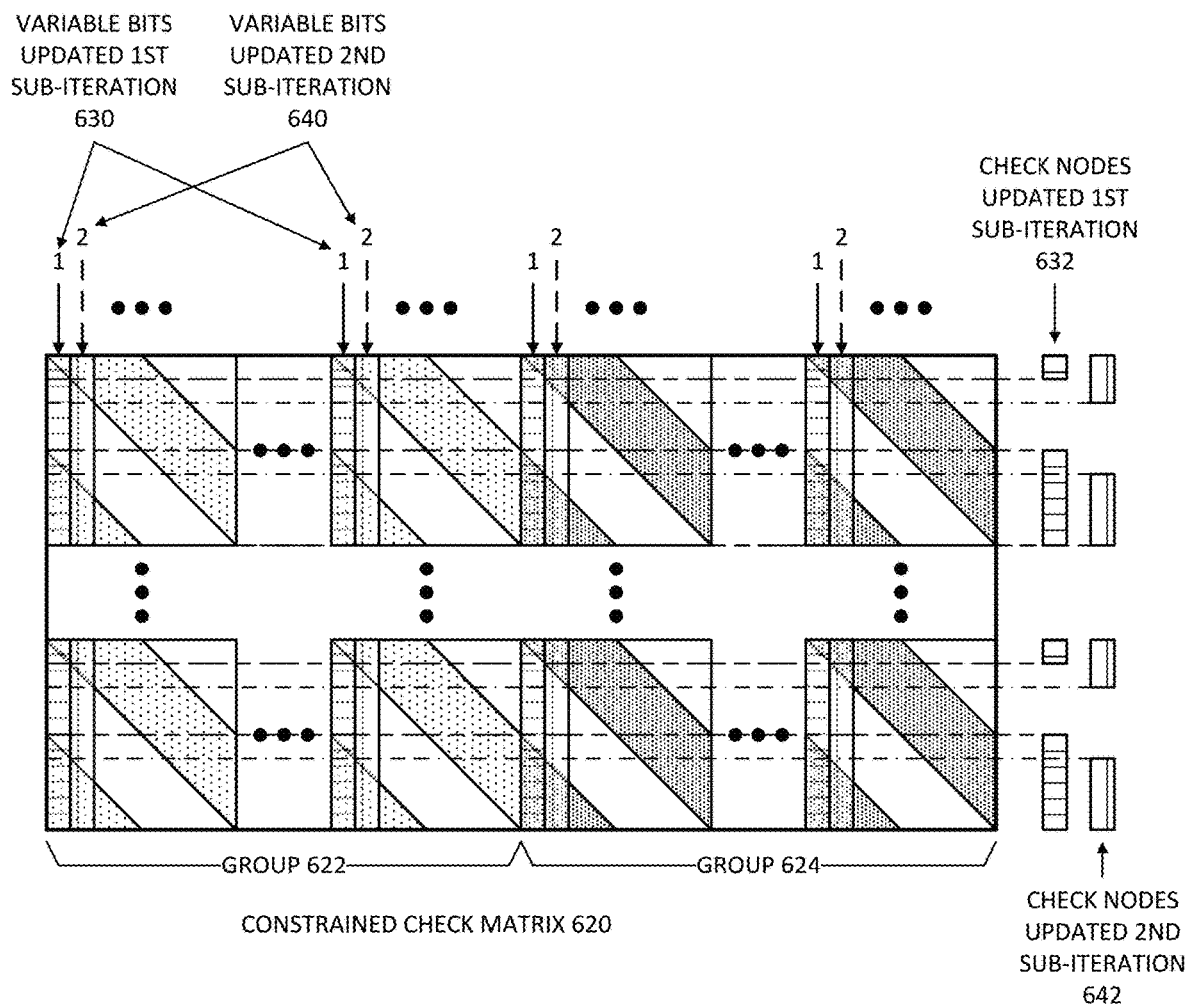
FIG. 6B is a block diagram of an example of a quasi-cyclic parity check matrix with constrained circulants.

FIG. 6B is a block diagram of an example of a quasi-cyclic parity check matrix with constrained circulants. Constrained check matrix 620 represents an example of a matrix with constrained circulants in accordance with constrained circulant 610 and represents the form of a matrix in accordance with system 500 of FIG. 5. A submatrix where there is only one non-zero element in each column of a given circulant can be thought of as a form of an identity matrix or permutation matrix. The given range or the bounded or constrained area is illustrated by the shading.

In one example of matrix 620, the circulants are constrained to only allow permutation matrices that are offset by the identity matrix within a given range. The given range or the bounded or constrained area is illustrated by the shading. Matrix 620 has a higher corresponding predictability in which check nodes are updated in a given sub-iteration. In one example where the range is restricted to the range of 0 to Q/2, half of the check nodes will not be updated within a sub-iteration. Note that Q/2 is a representative value; the range can be any fraction of Q, where Q is the length of the circulant.

The columns identified by 1, 2, . . . , represent, respectively, variable bits updated by the first sub-iteration 630, variable bits updated by the second sub-iteration 640, and so forth. To the right of matrix 620 the diagram illustrates how the constraint on the circulants constrains the check nodes that will be updated. More specifically, check nodes updated on the first sub-iteration 632 correspond to the variable nodes updated on the first sub-iteration 630, and check nodes updated on the second sub-iteration 642 correspond to the variable nodes updated on the second sub-iteration 640. Other sub-iterations are not illustrated.

In one example, matrix 620 is separated as group 622 and group 624. The two groups represent different segments or portions of the variable nodes, which can be assigned separate weights or separate scaling factors in accordance with what is described above. With different groups of check nodes, matrix 620 is segmented into different portions for decoding computations.

Figure 7:
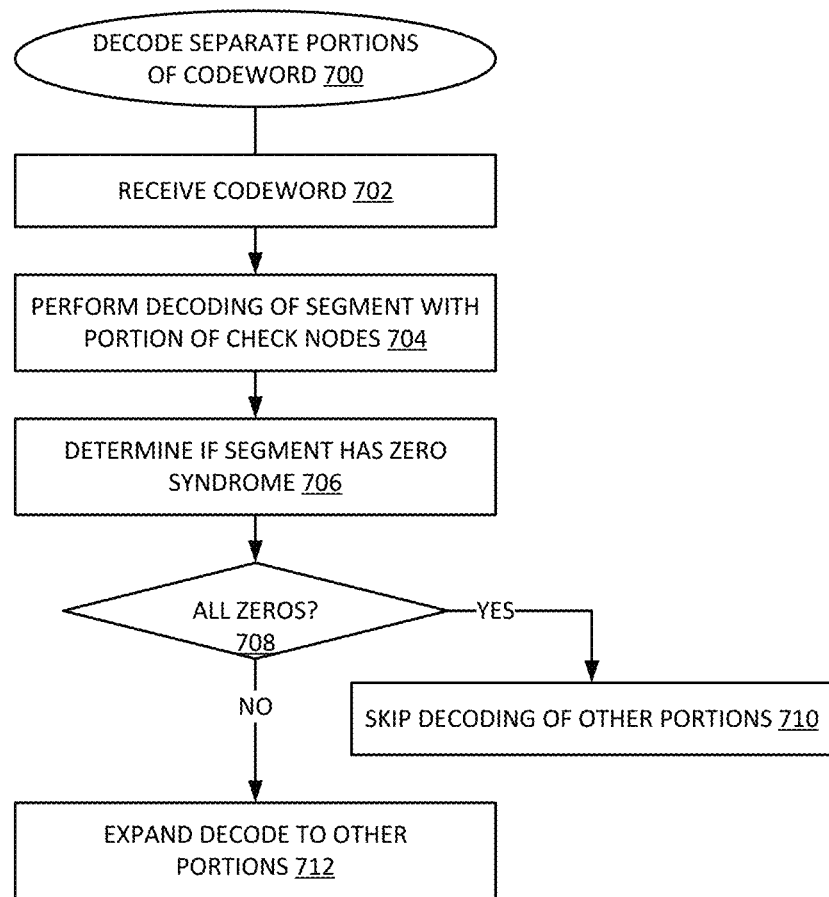
FIG. 7 is a flow diagram of an example of a process for decoding separate portions of a codeword.

FIG. 7 is a flow diagram of an example of a process for decoding separate portions of a codeword. Process 700 represents a process for decoding of separate portions of a codeword. The decoder receives a codeword, at 702. In one example, the decoder performs decoding of separate segments of the codeword with corresponding portions of check nodes, at 704.

In one example, the decoder determines if a selected segment has a zero syndrome, at 706. If the segment has all zeros, at 708 YES branch, in one example, the decoder can skip decoding the other portions of the codeword if the result for the selected segment is all that is needed, at 710. If the segment is not all zeros, at 708 NO branch, in one example, the decoder can expand the decoding to include the other portions or segments, at 712.

Figure 8:
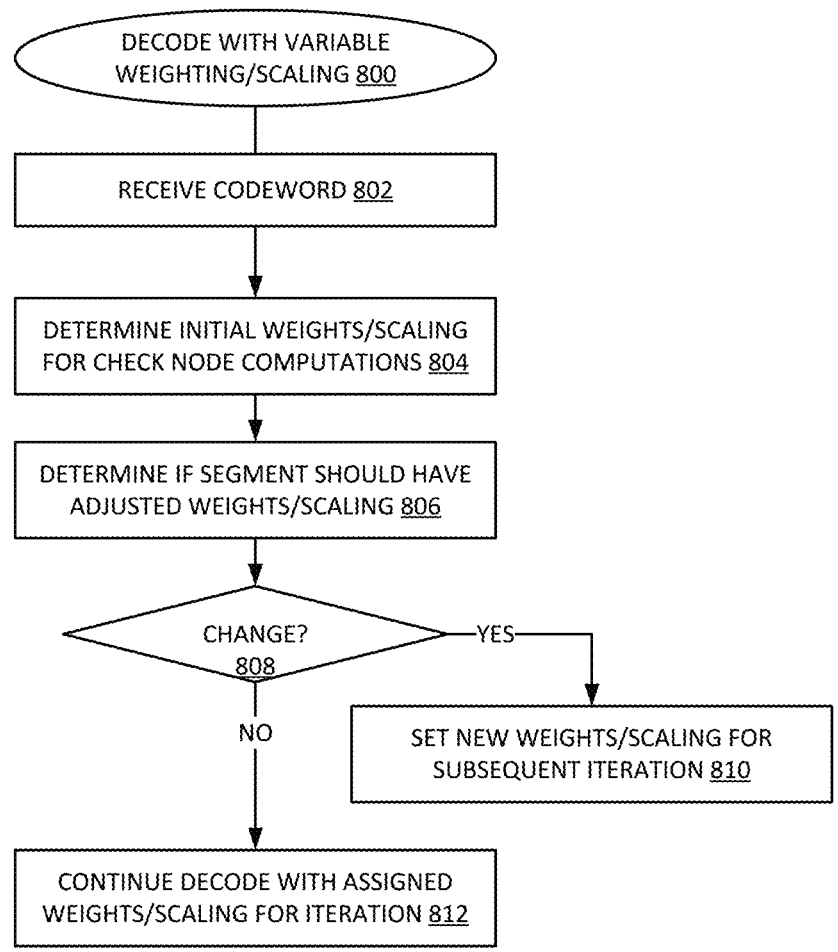
FIG. 8 is a flow diagram of an example of a process for decoding with variable weighting or scaling of the check nodes.

FIG. 8 is a flow diagram of an example of a process for decoding with variable weighting or scaling of the check nodes. Process 800 represents a process for applying variable scaling or weighting to check nodes for decoding of a segmented codeword or a constrained code codeword. The decoder receives the codeword, at 802. In one example, the decoder determines initial weights/scaling for check node computations, at 804. In one example, the initial weights/scaling can be different for different segments of the codeword check bits. In one example, the decoder can start with the same scaling or weighting and adjust it as decoding is performed.

In one example, the decoder determines if a selected segment should have an adjustment to its weights or scaling, at 806. If there should be a change, at 808 YES branch, in one example, the decoder can set new weights or scaling factors computed for the check nodes for subsequent iterations of the decoding operations, at 810. If the decoder determines no change is needed to the weight or scaling factors, at 808 NO branch, in one example, the decoder can continue for a subsequent iteration of computations with the assigned weights or scaling factors, at 812. It will be understood that the decoder can continue to perform the check on the weights and dynamically adjust the weighting or dynamically adjust the scaling based on computations performed during the decoding. Then the decoder can set new weights or scaling for a subsequent iteration of computations.

Figure 9:
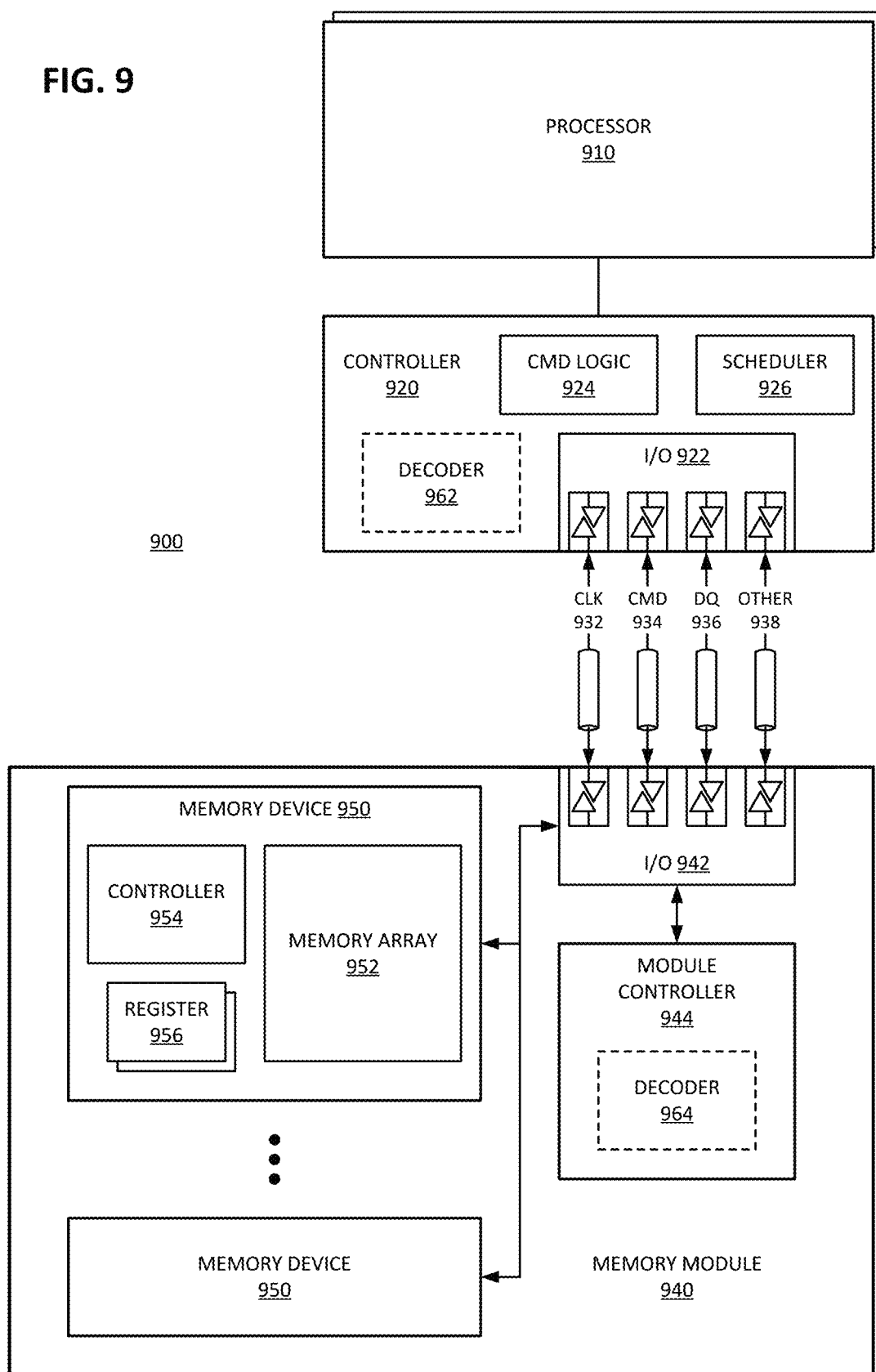
FIG. 9 is a block diagram of an example of a system with a memory subsystem in which a decoder that operates on segments of the check nodes can be implemented.

FIG. 9 is a block diagram of an example of a system with a memory subsystem in which a decoder that operates on segments of the check nodes can be implemented. System 900 includes a processor and elements of a memory subsystem in a computing device. System 900 includes decoder 946, which can be a decoder in accordance with any example of a decoder that works with a constrained code.

In one example, controller 920 of the host system includes decoder 962, which represents a decoder at the host side. Decoder 962 can apply variable initial LLRs for check nodes, variable check node scaling, variable weighting, or decode shortening, or a combination. In one example, decoder 962 segments a codeword into different portions to apply LDPC constrained code operations on the separate portions.

In one example, module controller 944 of the memory system includes decoder 964, which represents a decoder at the host side. Decoder 964 can apply variable initial LLRs for check nodes, variable check node scaling, variable weighting, or decode shortening, or a combination. In one example, decoder 964 segments a codeword into different portions to apply LDPC constrained code operations on the separate portions.

Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 900 can be implemented as an SOC (system on a chip), or be implemented with standalone components.

Controller 920 represents one or more controller circuits or devices for system 900. Controller 920 represents control logic that generates memory access commands in response to the execution of operations by processor 910. Controller 920 accesses one or more memory devices 950. Memory devices 950 can include volatile memory devices or nonvolatile memory devices, or a combination of volatile and nonvolatile memory. In one example, memory devices 950 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, each controller 920 manages a separate memory channel, although system 900 can be configured to have multiple channels managed by a single controller, or to have multiple controllers on a single channel. In one example, controller 920 is part of processor 910, such as logic implemented on the same die or implemented in the same package space as the processor.

Controller 920 includes I/O interface logic 922 to couple to a memory bus, such as a memory channel as referred to above. I/O interface logic 922 (as well as I/O interface logic 942 of memory module 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from controller 920 to I/O 942 of memory module 940, it will be understood that memory devices 950 can be accessed in parallel, and each memory device would include I/O interfaces to I/O 942.

The bus between controller 920 and memory devices 950 can be implemented as multiple signal lines coupling memory controller 920 to memory devices 950. The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between controller 920 and memory devices 950. An example of a serial bus technology is 9 B10 B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

In one example, memory devices 950 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 950 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 950 represent memory resources for system 900. Memory array 952 represents the memory resources, including memory cells or storage cells that hold the data. For a Write operation, an individual memory device 950 can write a portion of an overall data word in a parallel configuration or the whole word in a different configuration. Similarly, for a Read operation, an individual memory device 950 can fetch a portion of the overall data word or the entire data word.

In one example, memory devices 950 are disposed directly on a motherboard or host system platform (e.g., a PCB (printed circuit board) on which processor 910 is disposed) of a computing device. In one example, memory devices 950 can be organized into memory module 940. In one example, memory module 940 represents a dual inline memory module (DIMM). In one example, memory module 940 represent other organization of multiple memory devices to share at least a portion of access or control circuitry, which can be a separate circuit, a separate device, or a separate board (e.g., PCB) from the host system platform. In one example, memory devices 950 may be incorporated into the same package as memory controller 920, such as by techniques such as multi-chip-module (MCM), package-on-package, through-silicon via (TSV), or other techniques or combinations. Similarly, in one example, multiple memory devices 950 may be incorporated into memory modules 940, which themselves may be incorporated into the same package as memory controller 920. It will be appreciated that for these and other implementations, memory controller 920 may be part of host processor 910.

Memory module 940 includes module controller 944, which represents control logic on the memory module board, such as a controller or register device on a memory module PCB. In one example, module controller 944 represents a register clock device or other application specific integrated circuit (ASIC) device. Module controller 944 can control the exchange of commands to memory devices 950. In one example, module controller 944 manages ECC on memory module 940. The module-level ECC can be ECC for a nonvolatile memory device on the module, for example.

In one example, memory devices 950 include one or more registers 956. Register 956 represents one or more storage devices or storage locations that provide configuration or settings for the operation of the memory device. In one example, register 956 can provide a storage location for memory device 950 to store data for access by memory controller 920 as part of a control or management operation. In one example, register 956 includes one or more Mode Registers. The configuration of locations within register 956 can configure memory device 950 to operate in different "modes," where command information can trigger different operations within memory device 950 based on the mode.

Memory device 950 includes controller 954, which represents control logic within the memory device to control internal operations within the memory device. For example, controller 954 decodes commands sent by memory controller 920 and generates internal operations to execute or satisfy the commands. Controller 954 can be referred to as an internal controller, and is separate from memory controller 920 of the host.

Referring again to memory controller 920, memory controller 920 includes command (CMD) logic 924, which represents logic or circuitry to generate commands to send to memory devices 950. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions, memory controller 920 can issue commands via I/O 922 to cause memory device 950 to execute the commands. In one example, controller 954 of memory device 950 receives and decodes command and address information received via I/O 942 from memory controller 920. Based on the received command and address information, controller 954 can control the timing of operations of the logic and circuitry within memory device 950 to execute the commands. Controller 954 is responsible for compliance with standards or specifications within memory device 950, such as timing and signaling requirements. Memory controller 920 can implement compliance with standards or specifications by access scheduling and control.

Memory controller 920 includes scheduler 926, which represents logic or circuitry to generate and order transactions to send to memory device 950. From one perspective, the primary function of memory controller 920 could be said to schedule memory access and other transactions to memory device 950. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Reference to memory devices can apply to nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, whether byte addressable or block addressable, other byte addressable nonvolatile memory devices, or memory devices that use chalcogenide phase change material (e.g., chalcogenide glass), or resistance-based memory devices that store data based on a resistive state of a cell. In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 10:
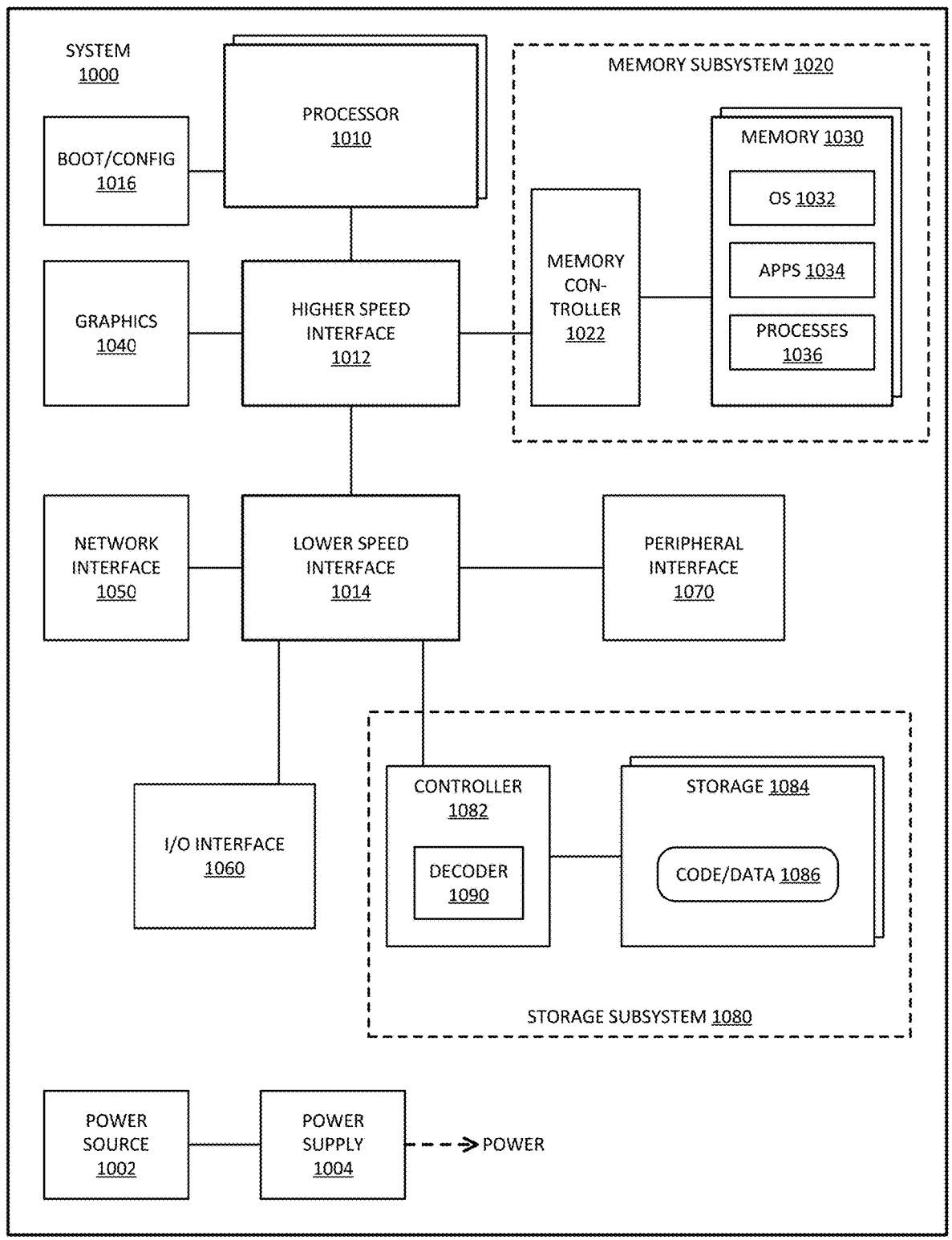
FIG. 10 is a block diagram of an example of a computing system in which a decoder that operates on segments of the check nodes can be implemented.

FIG. 10 is a block diagram of an example of a computing system in which a decoder that operates on segments of the check nodes can be implemented. System 1000 represents a computing device in accordance with any example herein, and can be a laptop computer, a desktop computer, a tablet computer, a server, a gaming or entertainment control system, embedded computing device, or other electronic device. System 1000 includes a decoder, which can be a decoder in accordance with any example of a decoder that works with a constrained code.

In one example, controller 1082 includes decoder 1090, which represents a decoder to perform LDPC decoding of data from storage 1084 in accordance with a constrained code. Decoder 1090 can apply variable initial LLRs for check nodes, variable check node scaling, variable weighting, or decode shortening, or a combination. In one example, decoder 1090 segments a codeword into different portions to apply LDPC constrained code operations on the separate portions.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 can be a host processor device. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

System 1000 includes boot/config 1016, which represents storage to store boot code (e.g., basic input/output system (BIOS)), configuration settings, security hardware (e.g., trusted platform module (TPM)), or other system level hardware that operates outside of a host OS. Boot/config 1016 can include a nonvolatile storage device, such as read-only memory (ROM), flash memory, or other memory devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display or ultra high definition (UHD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more varieties of random-access memory (RAM) such as DRAM, 3DXP (three-dimensional crosspoint), or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, 3DXP, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
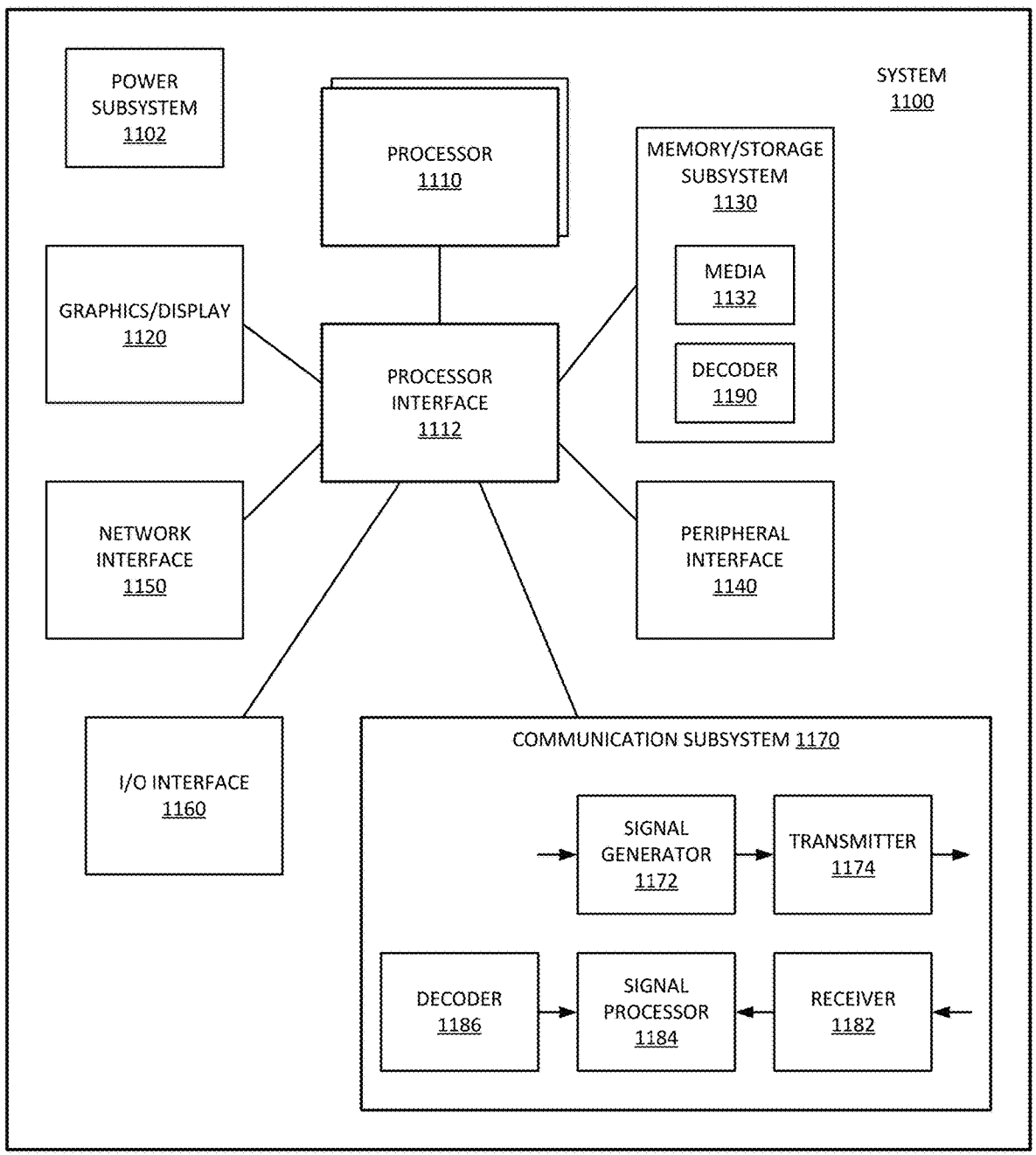
FIG. 11 is a block diagram of an example of a computing system with a communication subsystem in which a decoder that operates on segments of the check nodes can be implemented.

FIG. 11 is a block diagram of an example of a computing system with a communication subsystem in which a decoder that operates on segments of the check nodes can be implemented. System 1100 can represent a mobile computing device, such as a computing tablet, a mobile phone or smartphone, wearable computing device, or other mobile device, or an embedded computing device. System 1100 includes a processor and elements of a computing device. System 1100 includes a communication system with a decoder, which can be a decoder in accordance with any example of a decoder that works with a constrained code.

In one example, system 1100 includes communication subsystem 1170. Communication subsystem 1170 represents communication capability for system 1100. Communication subsystem 1170 represents a communication transceiver with a transmit path and a receive path. As a non-limiting example, communication subsystem 1170 includes signal generator 1172 to generate a communication signal from a source signal (illustrated by the arrow coming into signal generator 1172). Signal generator 1172 can pass the signal to transmitter 1174 for transmission via a communication medium. The communication medium can be wired, wireless, or optical. The transmitter generates a high bandwidth signal.

In one example, communication subsystem 1170 includes a receive path with receiver 1182 to receive a high bandwidth signal via the communication medium. Receiver 1182 passes the signal to signal processor 1184 for processing of the signal. In one example, the receive path includes decoder 1186, which can apply variable initial LLRs for check nodes, variable check node scaling, variable weighting, or decode shortening, or a combination. In one example, decoder 1186 segments a codeword into different portions to apply LDPC constrained code operations on the separate portions.

System 1100 includes processor 1110 can include any type of microprocessor, central processing unit (CPU), graphics processing unit (GPU), processing core, or other processing hardware, or a combination, to provide processing or execution of instructions for system 1100. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1100 includes interface 1112 coupled to processor 1110, to interface system components to the processor. In one example, processor interface 1112 is part of processor 1110, or integrated on the same chip as a processor core. Interface 1112 can be integrated as a circuit onto the processor die or integrated as a component on a system on a chip. Graphics/display 1120 represents an interface to graphics components for providing a visual display to a user of system 1100. Graphics/display 1120 can be a standalone component or integrated onto the processor die or system on a chip. In one example, graphics/display 1120 can drive a high definition (HD) or ultra-high definition (UHD) display that provides an output to a user. In one example, display subsystem includes or drives a touchscreen display.

Memory/storage subsystem 1130 provides storage for code to be executed by processor 1110, or data values to be used in executing a routine. Memory/storage subsystem 1130 includes one or more storage media 1132 to provide the storage. The different media refer to different storage technologies to hold the data. Memory/storage subsystem 1130 can include one or more varieties of random-access memory (RAM) such as DRAM, 3DXP (three-dimensional crosspoint), or other memory devices, or a combination of such devices. Memory/storage subsystem 1130 can include one or more devices to store data in a nonvolatile manner. The storage device(s) can be or include any conventional medium for storing large amounts of data in a nonvolatile manner, such as one or more magnetic, solid state, or optical based disks, or a combination. Nonvolatile storage holds data in a persistent state (i.e., the value is retained despite interruption of power). With volatile memory, the value or state of the data is indeterminate if power is interrupted).

Memory/storage subsystem 1130 stores and hosts, among other things, an operating system (OS) to provide a software platform for execution of instructions in system 1100, applications or programs that have their own operational logic to perform execution of one or more functions, and processes such as agents or routines that provide auxiliary functions to the OS or an application.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

Peripheral interface 1140 represents hardware interfaces and connectors, as well as software components (e.g., drivers, protocol stacks) to make peripheral connections. A peripheral device refers to a device that connects to system 1100 to send data to the device or receive data from the device. In addition to a proprietary docking connector or other proprietary connection hardware, system 1100 can make peripheral connections via peripheral interface 1140 with common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Network interface 1150 provides system 1100 the ability to communicate with remote devices (e.g., servers or other computing devices) over one or more networks. Network interface 1150 can include hardware (e.g., wired hardware, wireless hardware, or a combination of the two) and software components (e.g., drivers, protocol stacks) to enable system 1100 to communicate with external devices. Network interface 1150 can include an Ethernet adapter, wireless interconnection components, cellular network interconnection components, USB (universal serial bus), or other wired or wireless standards-based or proprietary interfaces. Network interface 1150 can exchange data with a remote device, which can include sending data stored in memory or receiving data to be stored in memory.

In one example, system 1100 includes one or more input/output (I/O) interface(s) 1160. I/O interface 1160 can include one or more interface components through which a user interacts with system 1100 (e.g., audio, alphanumeric, tactile/touch, or other interfacing).

Power subsystem 1102 provides power to the components of system 1100. More specifically, power subsystem can include a power source to interface with one or multiple power supplies. A power supply can include an AC to DC (alternating current to direct current) adapter to plug into a wall outlet. Such AC power can be renewable energy (e.g., solar power) power source. In one example, the power source includes a DC power source, such as an external AC to DC converter. In one example, the power source or power supply includes wireless charging hardware to charge via proximity to a charging field. In one example, power the source can include an internal battery or fuel cell source. Power subsystem 1102 can also include power management to manage battery power usage, charging of the battery, power saving operation, or other functions.

In general with respect to the descriptions herein, in one example, an apparatus includes: a low-density parity-check (LDPC) decoder to decode a codeword of length C, with check node computations performed as (N+1) segments of check nodes, where N is an integer greater than one, and where N segments of the check nodes are connected to a different C/N segment of the codeword and one segment of the check nodes has connections to the codeword of length C; and compute hardware to decode the codeword, including to perform computations for separate segments of C/N bits of the codeword with the N segments of the check nodes, including to adjust the decode computations based on an expected error rate for selected segments of the codeword.

In one example of the apparatus, the compute hardware to adjust the decode computations comprises the compute hardware to adjust a log likelihood ratio (LLR) of a segment of codeword based on the expected error rate. In accordance with any preceding example of the apparatus, in one example, to adjust the decode computations based on the expected error rate comprises the compute hardware to stop performing computations for one of the segments of the codeword and one of the segments of the check nodes in response to all check nodes of the one of the segments of the codeword having all zero syndromes. In accordance with any preceding example of the apparatus, in one example, to adjust the decode computations based on the expected error rate comprises the compute hardware to apply variable check-node scaling to selectively adjust a weighting factor for one of the segments of the check nodes based on a class of the check nodes. In accordance with any preceding example of the apparatus, in one example, to selectively adjust the weighting factor based on the class comprises selectively adjusting the weighting factor based on an address of check nodes. In accordance with any preceding example of the apparatus, in one example, to adjust the decode computations based on the expected error rate comprises the compute hardware to apply variable check node weighting to check nodes based on the expected error rate for the decode computations of selected segments of check nodes. In accordance with any preceding example of the apparatus, in one example, to apply the variable check-node weighting based on the expected error rate comprises the compute hardware to apply the variable check-node weighting based on raw bit error rate (RBER) for selected segments of the C/N bits of the codeword. In accordance with any preceding example of the apparatus, in one example, to apply the variable check node weighting based on the expected error rate comprises the compute hardware to apply the variable check node weighting for check nodes having error rates above a threshold error rate. In accordance with any preceding example of the apparatus, in one example, N equals 4, with four codeword segments of C/4 bits. In accordance with any preceding example of the apparatus, in one example, the compute hardware is further to decode the codeword with one segment of check nodes for each codeword segment of C/4 bits. In accordance with any preceding example of the apparatus, in one example, the codeword comprises a 2 KB received signal, wherein the compute hardware is to separately decode 512 B segments of the codeword. In accordance with any preceding example of the apparatus, in one example, the compute hardware is to decode one codeword segment of C/N bits, and stop decoding in response to a zero syndrome in the one codeword segment. In accordance with any preceding example of the apparatus, in one example, in response to a non-zero syndrome in the one codeword segment, the compute hardware is to decode all C bits of the codeword with other codeword segments to correct an error in the one codeword segment. In accordance with any preceding example of the apparatus, in one example, the LDPC decoder comprises an LDPC decoder of a memory device. In accordance with any preceding example of the apparatus, in one example, the LDPC decoder comprises an LDPC decoder of a communication subsystem.

In general with respect to the descriptions herein, in one example, a system includes: a receiver to receive a high bandwidth signal; and a low-density parity-check (LDPC) decoder to apply error correction to the received high bandwidth signal, the LDPC decoder including variable and check nodes to decode a codeword of length C, with check node computations performed as (N+1) segments of check nodes, where N is an integer greater than one, and where N segments of the check nodes are connected to a different C/N segment of the codeword and one segment of the check nodes has connections to the codeword of length C; and compute hardware to decode the codeword, including to perform computations for separate segments of C/N bits of the codeword with the N segments of the check nodes, including to adjust the decode computations based on an expected error rate for selected segments of the codeword.

In one example of the system, the compute hardware to adjust the decode computations comprises the compute hardware to adjust a log likelihood ratio (LLR) of a segment of codeword based on the expected error rate. In accordance with any preceding example of the system, in one example, to adjust the decode computations based on the expected error rate comprises the compute hardware to stop performing computations for one of the segments of the codeword and one of the segments of the check nodes in response to all check nodes of the one of the segments of the codeword having all zero syndromes. In accordance with any preceding example of the system, in one example, to adjust the decode computations based on the expected error rate comprises the compute hardware to apply variable check-node scaling to selectively adjust a weighting factor for one of the segments of the check nodes based on a class of the check nodes. In accordance with any preceding example of the system, in one example, to selectively adjust the weighting factor based on the class comprises selectively adjusting the weighting factor based on an address of check nodes. In accordance with any preceding example of the system, in one example, to adjust the decode computations based on the expected error rate comprises the compute hardware to apply variable check node weighting to check nodes based on the expected error rate for the decode computations of selected segments of check nodes. In accordance with any preceding example of the system, in one example, to apply the variable check-node weighting based on the expected error rate comprises the compute hardware to apply the variable check-node weighting based on raw bit error rate (RBER) for selected segments of the C/N bits of the codeword. In accordance with any preceding example of the system, in one example, to apply the variable check node weighting based on the expected error rate comprises the compute hardware to apply the variable check node weighting for check nodes having error rates above a threshold error rate. In accordance with any preceding example of the system, in one example, N equals 4, with four codeword segments of C/4 bits. In accordance with any preceding example of the system, in one example, the compute hardware is further to decode the codeword with one segment of check nodes for each codeword segment of C/4 bits. In accordance with any preceding example of the system, in one example, the codeword comprises a 2 KB received signal, wherein the compute hardware is to separately decode 512 B segments of the codeword. In accordance with any preceding example of the system, in one example, the compute hardware is to decode one codeword segment of C/N bits, and stop decoding in response to a zero syndrome in the one codeword segment. In accordance with any preceding example of the system, in one example, in response to a non-zero syndrome in the one codeword segment, the compute hardware is to decode all C bits of the codeword with other codeword segments to correct an error in the one codeword segment. In accordance with any preceding example of the system, in one example, the LDPC decoder comprises an LDPC decoder of a memory device. In accordance with any preceding example of the system, in one example, the LDPC decoder comprises an LDPC decoder of a communication subsystem. In accordance with any preceding example of the system, in one example, the system includes one or more of: a host processor device coupled to the receiver; a display communicatively coupled to a host processor; a network interface communicatively coupled to a host processor; or a battery to power the system.

In general with respect to the descriptions herein, in one example, a method includes: performing check node computations on a codeword of length C with a low-density parity-check (LDPC) decoder, including performing the computations as (N+1) segments of check nodes, where N is an integer greater than one, and where N segments of the check nodes are connected to a different C/N segment of the codeword and one segment of the check nodes has connections to the codeword of length C; and decoding the codeword, including performing computations for separate segments of C/N bits of the codeword with the N segments of the check nodes, including adjusting the decode computations based on an expected error rate for selected segments of the codeword.

In one example of the method, adjusting the decode computations comprises adjusting a log likelihood ratio (LLR) of a segment of codeword based on the expected error rate. In accordance with any preceding example of the method, in one example, adjusting the decode computations based on the expected error rate comprises stop performing computations for one of the segments of the codeword and one of the segments of the check nodes in response to all check nodes of the one of the segments of the codeword having all zero syndromes. In accordance with any preceding example of the method, in one example, adjusting the decode computations based on the expected error rate comprises applying variable check-node scaling to selectively adjust a weighting factor for one of the segments of the check nodes based on a class of the check nodes. In accordance with any preceding example of the method, in one example, selectively adjusting the weighting factor based on the class comprises selectively adjusting the weighting factor based on an address of check nodes. In accordance with any preceding example of the method, in one example, adjusting the decode computations based on the expected error rate comprises applying variable check node weighting to check nodes based on the expected error rate for the decode computations of selected segments of check nodes. In accordance with any preceding example of the method, in one example, applying the variable check-node weighting based on the expected error rate comprises applying the variable check-node weighting based on raw bit error rate (RBER) for selected segments of the C/N bits of the codeword. In accordance with any preceding example of the method, in one example, applying the variable check node weighting based on the expected error rate comprises applying the variable check node weighting for check nodes having error rates above a threshold error rate. In accordance with any preceding example of the method, in one example, N equals 4, with four codeword segments of C/4 bits. In accordance with any preceding example of the method, in one example, the method includes decoding the codeword with one segment of check nodes for each codeword segment of C/4 bits. In accordance with any preceding example of the method, in one example, the codeword comprises a 2 KB received signal, wherein the decoding comprises separately decoding 512 B segments of the codeword. In accordance with any preceding example of the method, in one example, decoding comprises decoding one codeword segment of C/N bits, and stop decoding in response to a zero syndrome in the one codeword segment. In accordance with any preceding example of the method, in one example, decoding comprises, in response to a non-zero syndrome in the one codeword segment, decoding all C bits of the codeword with other codeword segments to correct an error in the one codeword segment. In accordance with any preceding example of the method, in one example, the LDPC decoder comprises an LDPC decoder of a memory device. In accordance with any preceding example of the method, in one example, the LDPC decoder comprises an LDPC decoder of a communication subsystem.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A system, comprising:
a receiver to receive a high bandwidth signal; and
a low-density parity-check (LDPC) decoder to apply error correction to the received high bandwidth signal, the LDPC decoder including
variable and check nodes to decode a codeword of length C, with check node computations performed as (N+1) segments of check nodes, where N is an integer greater than one, and where N segments of the check nodes are connected to a different C/N segment of the codeword and one segment of the check nodes has connections to the codeword of length C; and
compute hardware to decode the codeword, including to first perform decode computations for N separate segments of C/N bits of the codeword with the N segments of the check nodes, including to adjust the decode computations based on an expected error rate for selected segments of the codeword, and then perform decode computations for the C bits of the codeword based on the decode computations for the N separate segments.

2. The system of claim 1, wherein the compute hardware to adjust the decode computations comprises the compute hardware to adjust a log likelihood ratio (LLR) of a segment of codeword based on the expected error rate.

3. The system of claim 1, wherein to adjust the decode computations based on the expected error rate comprises the compute hardware to stop performance of computations for one of the segments of the codeword and one of the segments of the check nodes in response to all check nodes of the one of the segments of the codeword having all zero syndromes.

4. The system of claim 1, wherein to adjust the decode computations based on the expected error rate comprises the compute hardware to apply variable check-node scaling to selectively adjust a weighting factor for one of the segments of the check nodes based on a class of the check nodes.

5. The system of claim 4, wherein to selectively adjust the weighting factor based on the class comprises selectively adjusting the weighting factor based on an address of check nodes.

6. The system of claim 1, wherein to adjust the decode computations based on the expected error rate comprises the compute hardware to apply variable check-node weighting to check nodes based on raw bit error rate (RBER) for selected segments of the C/N bits of the codeword, wherein to adjust the decode computations based on the expected error rate comprises the compute hardware to apply variable check-node weighting for check nodes having error rates above a threshold error rate.

7. The system of claim 1, wherein the compute hardware is further to decode the codeword with one segment of check nodes for each codeword segment of C/N bits.

8. The system of claim 1, wherein the compute hardware is to decode one codeword segment of C/N bits, and stop decoding in response to a zero syndrome in the one codeword segment, wherein in response to a non-zero syndrome in the one codeword segment, the compute hardware is to decode all C bits of the codeword with other codeword segments to correct an error in the one codeword segment.

9. The system of claim 1, further comprising one or more of:
a host processor device coupled to the receiver;
a display communicatively coupled to a host processor;
a network interface communicatively coupled to a host processor; or
a battery to power the system.

10. The system of claim 1, wherein N equals 4, with four codeword segments of C/4 bits.

11. The system of claim 10, wherein the compute hardware is further to decode the codeword with one segment of check nodes for each codeword segment of C/4 bits.

12. The system of claim 10, wherein the codeword comprises a 2 KB received signal, wherein the compute hardware is to separately decode 512B segments of the codeword.

13. The system of claim 1, wherein the LDPC decoder comprises an LDPC decoder of a memory device.

14. The system of claim 1, wherein the LDPC decoder comprises an LDPC decoder of a communication subsystem.

* * * * *